United States Patent [19]
Koziol et al.

[11] Patent Number: 5,242,667
[45] Date of Patent: Sep. 7, 1993

[54] SOLID PELLET FEEDER FOR CONTROLLED MELT REPLENISHMENT IN CONTINUOUS CRYSTAL GROWING PROCESS

[75] Inventors: Jurek K. Koziol; Jonathan A. Talbott, both of Nashua; Kedar P. Gupta, Merrimack, all of N.H.; George F. Lewis, Lowell, Mass.

[73] Assignee: Ferrofluidics Corporation, Nashua, N.H.

[21] Appl. No.: 736,703

[22] Filed: Jul. 26, 1991

[51] Int. Cl.$^5$ .............................................. C30G 15/02
[52] U.S. Cl. ................................ 422/249; 156/605; 156/617.1; 156/DIG. 115; 222/342
[58] Field of Search ................ 222/342, 345, 353; 156/605, 617.1, DIG. 115; 422/249

[56] References Cited

U.S. PATENT DOCUMENTS

| | | | |
|---|---|---|---|
| 3,960,503 | 6/1976 | Rice | 156/DIG. 115 |
| 3,998,686 | 12/1976 | Meiling et al. | 156/DIG. 115 |
| 4,094,448 | 6/1978 | Haseler et al. | 222/342 |
| 4,330,361 | 5/1982 | Kuhn et al. | 156/617 |
| 4,330,362 | 5/1982 | Zulehner | 156/617 |
| 4,411,377 | 10/1983 | Miksitz | 222/342 |
| 5,037,503 | 8/1991 | Kajimoto | 156/620.1 |

FOREIGN PATENT DOCUMENTS

| | | | |
|---|---|---|---|
| 170856 | 2/1986 | European Pat. Off. | 156/DIG. 115 |
| 2-102185 | 4/1990 | Japan | 422/249 |
| 1391985 | 4/1988 | U.S.S.R. | 222/342 |
| 2240287 | 7/1991 | United Kingdom | 422/249 |

*Primary Examiner*—Robert Kunemund
*Attorney, Agent, or Firm*—Cesari and McKenna

[57] ABSTRACT

The present invention is directed toward a feeder system for replenishing the melt in a crystal growing system that utilizes a heated crucible containing a pool of melted charge material from which a seen is withdrawn to grow the crystal. The feed system utilizes a storage hopper for storing solid pellets of the charge material. The storage hopper is provided with an opening at the bottom thereof which allows pellets to flow out of the hopper. A rotating plate is provided below the opening for collecting pellets that flow from the opening and enables piles of pellets to be formed thereon. A wiper is provided that extends across a portion of the plate and, as the plate is rotated, contacts the pellet piles to wipe pellets off of the plate. Thereafter, the pellets are collected and sourced to the melt to accomplish replenishment thereof.

33 Claims, 6 Drawing Sheets

SOLID PELLET FEEDER FOR CONTROLLED MELT REPLENISHMENT IN CONTINUOUS CRYSTAL GROWING PROCESS

BACKGROUND OF THE INVENTION

1. Field of the Invention

This invention relates generally to crystal growing systems utilizing a melt and a crystal seed that is withdrawn therefrom. More particularly, this invention relates to a feeder for controlling the flow of pelletized solid charge material into the melt to replenish the melt simultaneously with continuing crystal growth.

2. Background Discussion

Several techniques are known in the art for growing crystals. The Czochralski process is the most widely used of these processes and is generally summarized below. A heated crucible is provided for holding a melted form of a charge material from which the crystal is to be grown. The melt is maintained at a temperature slightly above that at which the charge material crystallizes. A seed is placed at the end of a cable or rod that will enable the seed to be lowered into the melt material and then raised back out of the melt material. The seed can be either a sample of the desired crystal material or any other material that has the same crystalline structure and a higher melting temperature. When the seed is lowered into the melt material, it causes a local decrease in melt temperature, as is known to those skilled in the art, which results in a portion of the melt material crystallizing around and below the seed. Thereafter, the seed is slowly withdrawn from the melt. As the seed is withdrawn, the portion of the newly formed crystal that remains within the melt essentially acts as an extension of the seed and causes melt material to crystallize around and below it. This process continues as the crystal is withdrawn from the melt, resulting in crystal growth as the seed is continually raised.

As described above, crystal growth results from crystallization of the melt material. Therefore, as the crystal grows, the amount of melt material contained within the crucible is correspondingly decreased. Many prior art crystal growing systems were incapable of replenishing the melt simultaneously with continuing crystal growth. Consequently, the systems suffered from a number of disadvantages that are more fully described below.

In a system utilizing the Czochralski process, the crucible is located within a furnace that heats the crucible around its exterior surface resulting in thermal convection and a non-uniform temperature field. Therefore, the crucible is rotated in an attempt to provide even heat distribution throughout the melt. However, because the crucible is heated only around its exterior surface, changes in the melt level within the crucible result in changes in the thermo gradients of the melt. Any change in the thermo gradients during the growth of a crystal is undesirable because it changes the growing conditions for the crystal and results in a crystal that does not have uniform properties over its entire length. In an effort to maintain uniform growing conditions as the melt level decreased, a number of prior art systems correspondingly raised the crucible as the crystal was raised However, as the crucible was raised, the transfer coupling between the heating system and the crucible necessarily changed which resulted in changes in the thermo gradients of the melt. Additionally, this attempted solution added complexity and cost to the system by requiring that some apparatus be provided for raising the crucible A further disadvantage resulting from the inability to replenish the melt is that system operation is delayed whenever the melt material is exhausted. When the melt material is exhausted, the furnace must be cooled down, cleaned, reloaded and then reheated to the appropriate temperature. As a result, these systems experience long cycle times with only a fraction of the cycle time being devoted to actually growing crystals.

In view of the foregoing, systems have been developed that allow the melt material to be replenished simultaneously with continuing crystal growth. An example of such a system is disclosed in Japanese Patent No. 49-10664 issued to Yamashita. In the Yamashita system, the addition rate of replenishing pellets into the melt is controlled by a vibratory system A feedback mechanism detects the level of the melt and sends a control signal to the vibratory system to specify the amount of charge material to be added to the crucible. The charge material is provided in the form of solid pellets The feeder system provides the pellets on a horizontal plate that is capable of undergoing vibration. When the melt level is sufficient so that no charge material need be added, a command is sent to the horizontal plate that stops it from vibrating and thereby ensures that no pellets will be displaced off of the plate and into the crucible Conversely, when the melt level is insufficient so that it needs to be replenished, a command is sent to the horizontal plate which causes it to be vibrated, thereby causing pellets located on the plate to be displaced off of the plate and into the crucible The number of pellets that are displaced off of the plate is related to the intensity with which the plate is vibrated.

The Yamashita system suffers from a problem relating to its inability to precisely control the amount of replenishment material fed into the system. In order to maintain constant growing conditions for the crystal, it is desirable to maintain the melt at a constant level Therefore, the addition rate of the replenishing material should be equal to the growth rate of the crystal The Yamashita system cannot precisely control the addition rate of the replenishing material because of the type of feeder system it utilizes. The charge material is provided in the form of pellets that necessarily have some variation in size. Different size pellets respond differently to the vibrations that are imparted thereto by the vibrating plate. Therefore, the vibratory system tends to sort the pellets by size. As a result, for any given duration and intensity level of vibration, the amount of charge material that will be sourced into the melt is not fixed. Rather, the addition rate is dependent upon the size of the pellets that happen to be on the vibratory plate at any given time. Consequently, the amount of replenishment material added to the melt cannot be controlled with specificity which results in the system being unable to maintain the melt at a constant level with the required degree of precision.

Another type of prior art feeder system is disclosed by Lane in European Patent Application number 0170856. Lane discloses the use of a storage hopper for storing particles of solid charge material The hopper is provided with an opening at the bottom thereof which allows the particles to flow out of the hopper. A conveyor belt is provided below the opening and collects the particles that flow out of the hopper. In this manner, piles of the particles are formed between the conveyor and the opening. The conveyor belt has rollers positioned at each end that advance the belt which thereby advances the particles piled thereon. As the conveyor advances, particles of charge material are displaced off the edge of the belt and into the crucible to replenish the melt.

The Lane system improves upon some of the disadvantages of the Yamashita system because the feed rate of the Lane system varies less in response to changes in individual particle sizes. However, it is believed that the Lane design has a number of potential problems. First, as is more fully described below, an important consideration in designing crystal growing systems is minimizing contamination of the charge material. The Lane belt must be made from a flexible material in order to to operate properly and it is difficult to find a flexible material that is non contaminating with respect to many common charge materials. Second, the system utilizes a number of moving parts contained within the enclosed portion of the system. For reasons that are more fully described below, it is desirable to enclose the portions of the crystal growing system that come into contact with the charge material within a vacuum chamber. The charge materials used to grow crystals, such as silicon, are often quite abrasive. As a result, abrasive dust particles of the charge material are plentiful inside the enclosure. These abrasive dust particles can build up between moving parts of the system and cause grinding therebetween. Since the moving parts are generally formed from a contaminating material, the grinding of the moving parts can cause particles of that material to become chipped off, which eventually results in the chipped particles entering the melt and causing the contamination thereof. Additionally, the grinding of the moving parts can result in a need to replace the moving parts frequently. Therefore, it is desirable to reduce the number of moving parts that are contained within the enclosure in order to reduce costs associated with maintaining the system. The Lane system has at least two moving parts, i.e. the two rollers for the conveyor belt, located within the enclosure. Third, the Lane belt necessarily has some sag associated with its center portion when a pile of particles is placed thereon. As a result, the distance between the belt and the hopper can vary depending upon the amount of particles piled on the belt. For reasons that are more fully explained below, this variation in pile size can undesirably vary the feed rate of the system.

Accordingly, it is an object of the present invention to provide, for a crystal growing system, an improved feeder system that provides precise control over the addition rate of pelletized charge material for replenishing the melt simultaneously with continuous crystal growth, and further improves upon the problems associated with the prior art systems.

SUMMARY OF THE INVENTION

The present invention is directed toward a feeder system for replenishing the melt of charge material in a crystal growing system, the feeder system including a hopper for storing solid pellets of charge material, the hopper having an opening that allows the pellets to flow out of the hopper in a flow direction. The pellets fall onto a rotating rigid plate located below the opening and form a contiguous ring of uniformly sized piles. The plate rotates around an axis which is parallel to the pellet flow direction and continually moves the piles away from the hopper opening and into contact with a wiper that extends across a portion of the plate thereby causing pellets within the piles to be displaced off of the plate and into the melt for replenishment thereof.

DETAILED DESCRIPTION

Figure 1:
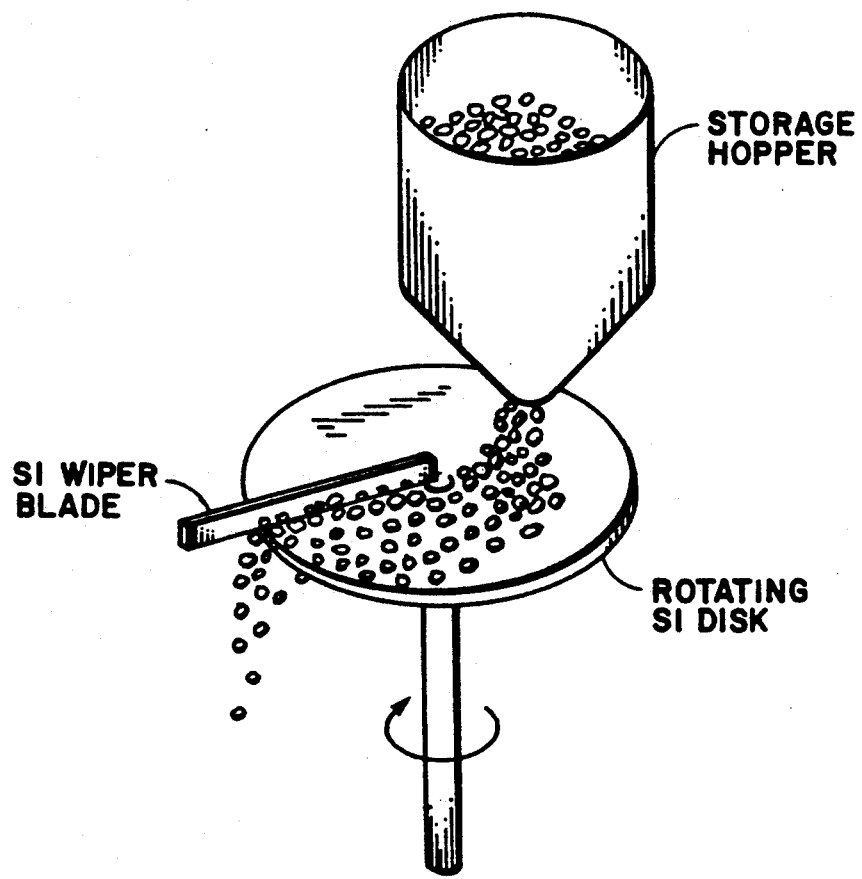
FIG. 1 is a conceptual drawing showing the manner in which pellets are removed from the disk.

Reference is made to FIG. 1 for a general explanation of the feeder system of the present invention. Pelletized charge material is stored in a storage hopper that is positioned above a rotating disk. Pellets flow freely out of a storage hopper opening and onto the disk until a pellet pile is formed extending from the disk to the hopper opening. The disk is rotated to carry the pellet pile away from the opening and toward a wiper blade which wipes piled pellets off of the disk. A funneling system that is not shown in FIG. 1 is used to collect the pellets that are wiped off of the disk and carry them to the crucible where they are used to replenish the melt. As the disk is rotated, new pellet piles are formed under the hopper opening thereby defining a contiguous ring of pellets along the disk. Each pile formed is of a uniform size that relates to the rate at which the melt is replenished because it controls the amount of pellets that are wiped off of the disk and into the melt.

Figure 2:
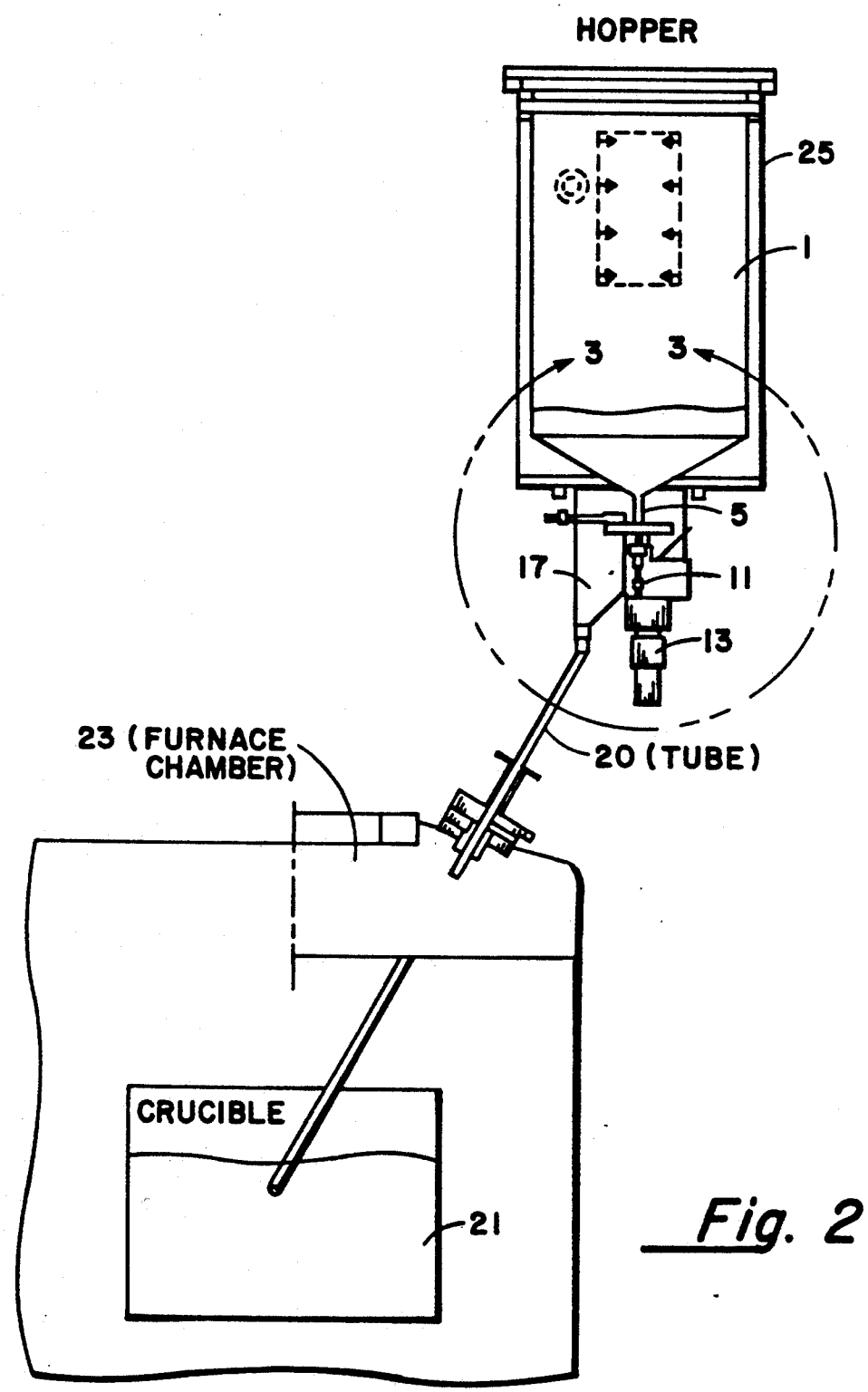
FIG. 2 is a side view of the replenishment system.
Figure 3:
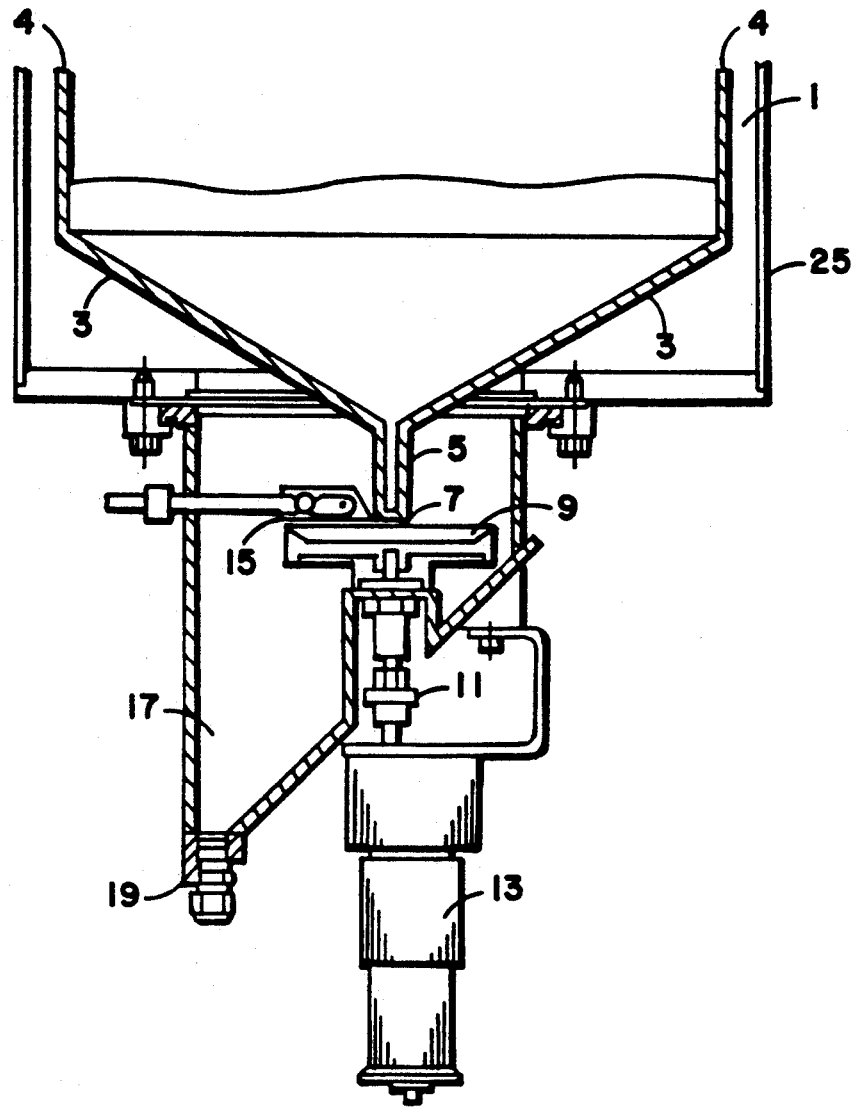
FIG. 3 is a more detailed view of the feed control system that is circled in FIG. 2.

A more detailed explanation of the present invention is now provided making reference to Figs. 2-3. FIG. 2 is a side view of the replenishment system with the circled portion thereof shown in more detail in FIG. 3. A hopper 1 is provided for storing pelletized solid charge material. The lower portion of the hopper is provided with angled sidewalls 3 that serve to funnel the pellets to a discharge tube 5 provided at the bottom of the hopper. The discharge tube extends vertically downward from the sidewalls of the hopper and is provided with a hopper discharge mouth 7 at its bottom end. The discharge mouth is simply an opening at the bottom of the discharge tube. The hopper provides pellets to the system in the following manner. After pellets are placed within the hopper, gravitational force acts upon the pellets and causes them to move downward. The sidewalls 3 funnel the pellets into the discharge tube 5 where they simply fall through the discharge mouth 7. In this manner, the pellets flow freely out of the hopper until a pile of pellets is formed underneath the discharge mouth which prevents further pellet flow as is described in more detail below.

A disk 9 is located immediately below the hopper discharge mouth 7. As pellets flow out of the hopper discharge mouth, they collect on the disk and form a pile thereon as is more fully described below. In one embodiment of the invention, the disk 9 is provided with a recessed interior portion that defines a concave surface; the concave shape of the disk provides advantages that are more fully described below. The bottom surface of the disk 9 is connected to a shaft 11 which is in turn connected to a variable speed motor 13. The motorized shaft allows the disk 9 to be rotated at any of a number of varying speeds.

A wiper blade 15 extends from a sidewall of the funneling enclosure 17 outward across a portion of the disk 9. The wiper blade is positioned at a height slightly above the top surface of the disk.

A funneling enclosure 17 is provided around the disk 9. The funneling enclosure serves to funnel the pellets that are wiped off of the disk 9 into an opening 19 that is positioned at the bottom of the funneling enclosure. A tube 20 is connected to the opening 19 and provides a passageway for carrying the pellets from the funneling enclosure 17 to the crucible 21. The crucible 21 is contained within a furnace chamber 23 so that the tube 20 must pass through an opening in a wall of the furnace chamber. For reasons known to those skilled in the art, it is important that the furnace chamber be isolated from any oxygen source. Therefore, much of the above described system is contained within a vacuum box 25. The vacuum box 25 surrounds the hopper 1 and defines the funneling enclosure 17 which surrounds the disk 9 and wiper blade 15. The shaft 11 passes through a seal in the vacuum box 25. The motor 13 is positioned outside of the vacuum box. In this manner, the number of moving parts that are contained within the enclosure is minimized. As previously described, this minimization is desirable because dust particles of the charge material can be plentiful within the enclosure and can increase wear on the moving parts, thereby increasing the potential for contamination of the melt and the maintenance costs of the system.

Figure 4:
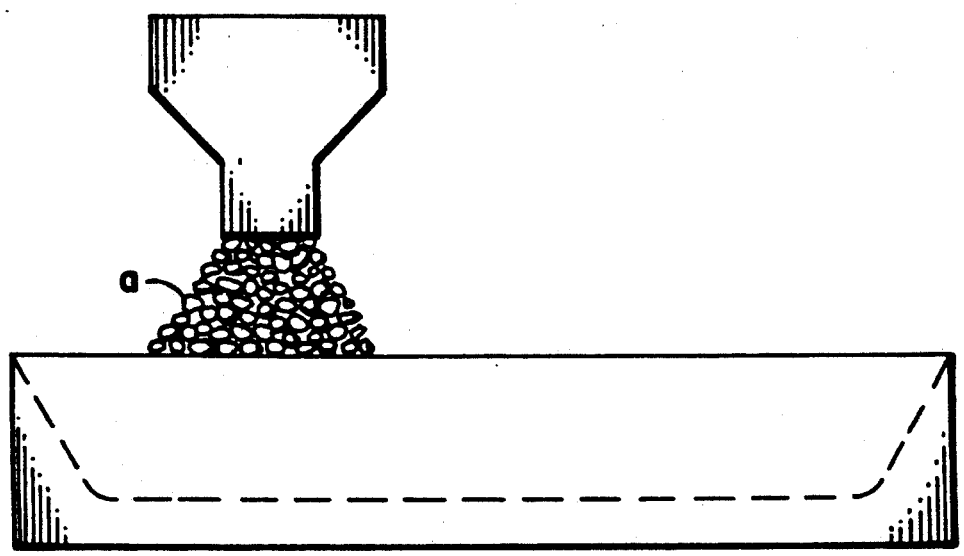
FIG. 4 is a side view of the hopper positioned above the disk and having a pile of pellets formed therebetween.

The principles of operation of the feed control system will next be described making reference to Figs. 1, 3 and 4. The system of the present invention can utilize the disk 9 either in a stationary mode, or in a mode wherein it rotates at any one of a number of desired speeds. When the disk 9 is not rotating, it effectively acts as a shut-off valve for the flow of pellets in the following manner. Pellets will initially flow down from the hopper discharge mouth 7 and onto the disk 9. If the concave interior of the disk is not completely full of pellets, the pellets will disperse so as to fill the interior. If the concave interior is full, a pile of pellets will form under the hopper discharge mouth and will grow until it eventually becomes high enough to reach the discharge mouth. Further flow of pellets from the hopper discharge mouth will thereafter be prevented by friction between the pellets that form the pile thereunder. Thus, by stopping the rotation of the disk 9, the system can effectively shut off the flow of pellets from the hopper.

The size of the pellet pile that forms under the hopper discharge mouth is dependent, among other factors, upon the angle of repose of the pelletized charge material. The angle of repose is a concept well known to those skilled in the art of handling bulk materials and defines the maximum slope at which piled material will stand without sliding on itself. As can be understood even by those unskilled in the art, when bulk material is poured onto a surface, it forms a pile. The slope of the pile edges depends upon the size and shape of the particles that comprise the bulk material. Thus, for a given type of material there is an angle of repose that defines the slope of the pile edges. The angle of repose of the pellet pile is illustrated in FIG. 4 by the angle a.

If a bulk material is comprised of individual elements that are identically sized and shaped, all piles made from the bulk material will have a constant angle of repose. Conversely, as a general rule, when the size of the elements that comprise the bulk material varies, the angle of repose of the material also varies. The pelletized charge material utilized in crystal growing systems necessarily has some small variation between the sizes of the individual pellets. Therefore, the pelletized charge material utilized in the hopper of the present invention will be a mixture of variously sized pellets. For any given mixture of pellet size distribution, the charge material will have a unique angle of repose. As long as the mixture and distribution of pellet sizes remain constant, the angle of repose for the material within the hopper will remain constant. In general, it has been found that the mixture and distribution of pellet sizes within given samples of pelletized charge material remains constant Therefore, it is assumed that the angle of repose for each pile of material will remain constant as the material contained within the hopper flows out thereof. The angle of repose for a material directly effects the size of pile that will be formed by the material and thereby effects the amount of material contained within the pile. Consequently, since the angle of repose remains constant, the size of the piles formed below the hopper discharge mouth remains constant and does not vary as the pelletized material flows out of the hopper As explained below, by relying upon the angle of repose for the mixture and distribution of pellet sizes that comprise the bulk of the charge material, the charge material feed rate of the present invention is unaffected by variations in individual pellet size. The charge material feed rate is directly related to the size of the pellet pile that is wiped off of the disk, which is in turn directly related to the angle of repose for the bulk material. When the disk 9 is in its non rotational mode, no pellets contact the wiper blade 15 in a manner that causes them to be wiped off of the disk. However, when the disk is rotated, the wiper blade contacts the pellets that are piled above the upper surface of the disk and displaces them from the disk. Thereafter, the pellets fall into the funnel 17, are funneled through the opening 19 and are sourced into the crucible 21. As shown in FIG. 1, the wiper blade is located downstream from the hopper discharge mouth so that the rotation of the disk carries the piles of pellets toward the wiper blade.

Figure 5:
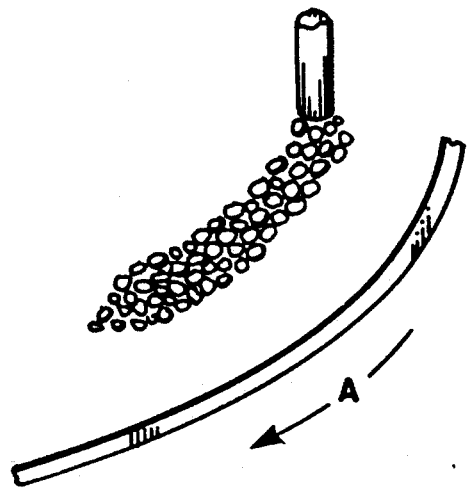
FIG. 5 is a perspective view showing a ring of pellets formed along the disk.

It is important to note that, even when the disk is rotated at its maximum rate, the rate of rotation is slow enough so that the piles of pellets continually formed will each grow to a maximum height wherein they extend to the hopper discharge mouth and thereby prevent further pellet flow. The disk is not rotated in a rapid fashion that would allow the pellets to be displaced off of the disk quicker than a new pile could be formed. Therefore, as shown in FIG. 5, uniformly sized piles of pellets are continually created under the hopper discharge mouth and form a ring of pellets around the rotating disk. As a result, when the disk is rotated at a constant rate, the amount of charge material displaced from the disk by the wiper blade is uniform and is directly related to size of the pellet piles. The disk 9 can be manufactured from a material that is sufficiently rigid so that it will not deform under the weight of pellet piles formed thereon Therefore, the size of the pellet piles will not vary depending upon the amount of charge material contained on the disk.

A key feature of the feeder system of the present invention is that it enables the system to maintain a constant addition rate of charge material despite variations in pellet size. By preventing fluctuations in the addition rate due to pellet size variation, the feeder is able to maintaining the melt at a constant level by more precisely ensuring that the charge material addition rate equals the growth rate of the crystal. As stated above, the thermo gradients within the melt material change as the melt level changes which results in non uniformities in the crystal. By ensuring that the melt is maintained at a constant level despite variations in pellet size, the present invention allows for more uniform crystal growth.

As stated above, one goal of the present invention is to ensure that the charge material addition rate is equal to the growth rate of the crystal. In order to determine and control the charge material addition rate, the following four variables must be considered because each effects the addition rate. First, the rate of rotation of the disk 9. As stated above, the disk 9 is connected to a variable speed motor 13 that allows the rate of rotation of the disk to be varied. The rate of rotation of the disk impacts the addition rate by determining the pace at which pellets contact the wiper blade 15 and are thereby displaced from the disk 9 and sourced to the crucible 21. Although the system of the present invention can accomodate a wide range of rotation rates, there are some limits on the maximum rate that should be utilized. If the chosen rate of rotation were too fast, centrifugal force would act upon the piles and cause pellets to be dispersed toward the outer edges of the disk. This would be undesirable because the height of the piles would no longer be determined solely by the angle of repose of the material, thereby reducing the precision with which the volume of material contained within the piles could be controlled. In the preferred embodiment of the invention for use in growing silicon crystals, it has been found that, for a disk size of approximately 5 inches in diameter, rotation rates of less than 50 rotations per minute are sufficiently slow to avoid these problems.

Second, the height at which the hopper discharge mouth 7 is positioned above the disk. As the height of the discharge mouth above the disk is increased, the size of the pellet pile that is formed therebetween is also increased. Consequently, for a constant rate of disk rotation, the charge material addition rate is increased when the height of the discharge mouth above the disk is increased. In general, this variable can be freely adjusted, along with the other variables, to create a system with the proper charge material addition rate. However, there is a limit as to the minimum height that should be selected. The present invention assumes that all pellet piles will have a constant angle of repose because it is assumed that the bulk material contains a uniform mixture of pellet sizes. This assumption has been shown to be accurate for reasonably sized piles. However, if very small piles were utilized, the small sampling of pellets could render the assumption less accurate and result in less precise system performance. Consequently, the height of the hopper discharge mouth above the disk should be maintained at a level that will provide piles that are sufficiently large to enable the above described assumption to be accurate. In the preferred embodiment of the invention, it has been found that a height of 0.25 inches above the upper surface of the disk is sufficient.

Third, the radial distance away from the disk center above which the center of the hopper discharge mouth 7 is positioned. As explained below, an increase in the radial distance away from the center of the disk increases the charge material addition rate. Regardless of the radial positioning of the hopper discharge mouth, the piles formed thereunder will have a fixed width extending radially along the disk. However, the length of the pile ring will vary depending upon the radial positioning of the hopper discharge mouth. For a single disk rotation, pile rings formed along the outer edge of the disk will have a length approximately equal to the circumference of the disk, whereas pile rings formed near the center of the disk will have correspondingly smaller lengths. Since the length of the pile ring is related to the amount of charge material that is displaced during a single disk rotation, the radial positioning of the hopper discharge mouth directly effects the charge material addition rate. There are also limits to the range over which this variable should be adjusted. As is more fully described below, the pellet material, particularly if it is silicon, can be abrasive. Therefore, the scraping of the material on the wiper blade can wear the wiper blade and result in the need for frequent changing of parts. Consequently, it is desirable to position the hopper discharge mouth somewhat near the outer edge of the disk so that the distance over which the wiper blade 15 wipes the pellets is minimized. In the preferred embodiment of the invention, the hopper discharge mouth is adjustable so that it can be positioned at a distance away from the center of the disk ranging from 0-2 inches. One embodiment of the invention, as described below in connection with FIG. 6, has been tested and shown to function satisfactorily. In this particularly embodiment, the hopper discharge mouth is located directly above the center of the disk.

Fourth, the size of the hopper discharge mouth. The greater the diameter of the hopper discharge mouth, the wider the pile of pellets will be. Consequently, if the diameter of the hopper discharge mouth is increased, the charge material flow rate is increased. In the preferred embodiment of the invention, the hopper discharge mouth has a diameter of 0.75 inches.

Figure 6:
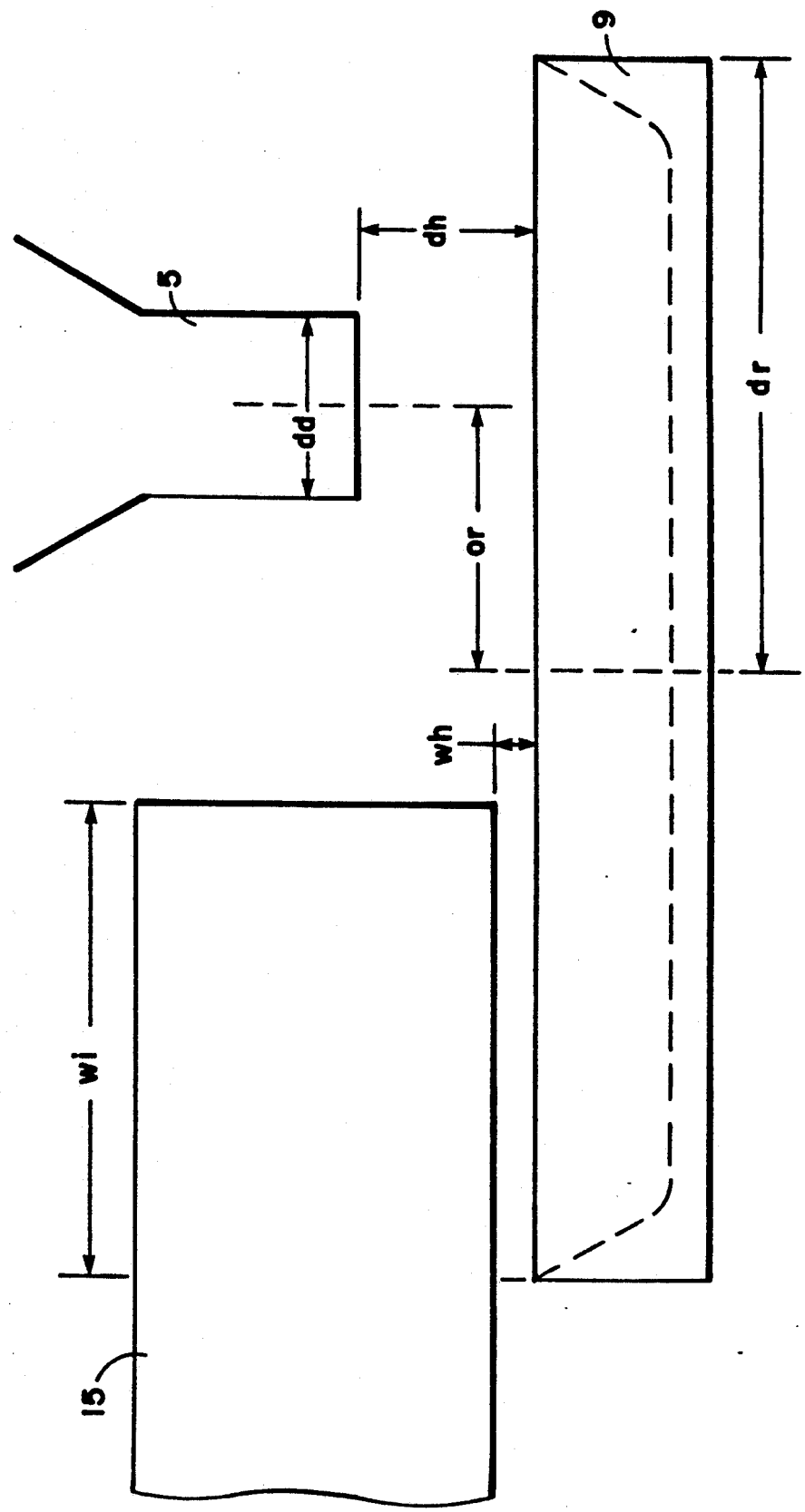
FIG. 6 is a side view of the feeder system showing several relevant dimensions.

FIG. 6 illustrates the above described dimensions of the preferred embodiment, as well as the dimensions of other relevant elements of the feeder system. The dimensions of the preferred embodiment, as well as a brief explanation of each variable, follows:

dr—2.5 inches for the disk radius;
dd—0.75 inches for the discharge mouth diameter;
dh—0.25 inches for the discharge mouth height above the disk;
or—0.0 inches for the offset radius defining the radial distance away from the center of the disk at which the center of the discharge hopper mouth is positioned;

wi—2.125 inches for the wiper insertion defining the extent to which the wiper blade extends across the disk;

wh—0.1 inches for the wiper blade height above the disk.

As previously stated, there are numerous combinations of these various dimensions that can be combined to achieve satisfactory performance of the present invention. The above described preferred embodiment is merely one combination of dimensions that has been used, tested and found to perform satisfactorily in a system for growing silicon crystals utilizing granulated solid polycrystalline silicon pellets. The average pellet size for this material is 0.15 cm and the bulk material has a density of 1.45 g/cm$^3$. The density is another parameter that must be considered when determining the charge material addition rate because it relates the volume of pellet material to the amount of charge material. As previously stated, one goal of the present invention is to control the charge material addition rate so that it equals the crystal growth rate. Typical crystal growth rates range from 10–50 grams per minute. Although the dimensions of the preferred embodiment have been disclosed above, it will be understood that numerous other combinations of dimensions, subject to the limitations discussed above, are possible that will achieve equally satisfactory results.

As shown in FIG. 2, the preferred embodiment of the invention utilizes a disk that has a concave shape. Although the concave disk provides the advantages over a flat disk that are discussed below, it should be realized that the invention could be practiced utilizing a flat disk and that the use of a concave disk is simply an improvement rather than a requirement. The concave disk provides three advantages over a flat disk surface. First, the concave disk is helpful in assuring that the system completely stops the flow of pellets when the disk is not rotating. With a flat disk, pellets are more likely to become displaced off of the side of the disk due to vibration. However, the concave disk acts to restrain the pellets and prevents them from being inadvertently displaced off of the disk. Second, the concave disk diminishes the potential for pellets becoming jammed between the wiper and disk when the wiper is attempting to wipe pellets off of the disk. Jamming is more likely if a flat disk is utilized and can result in a disruption of the system. Third, the concave disk reduces wear on the disk by diminishing abrasion of the disk surface that results from friction between the disk and pellets when pellets are wiped off of the disk. As stated above, the pellet material, particularly if it is silicon, can be quite abrasive. Therefore, the use of a concave disk limits the wear on the disk and enables it to have a longer useful life in the system. Although some friction is transferred to the bottom surface of the concave disk as a result of wiping between the wiper blade and the pellets, this friction is far less than would be experienced on the surface of a flat disk.

As previously stated, the pellet material, particularly if it is silicon, can be quite abrasive. The majority of the scraping caused by these pellets occurs when they are wiped off of the disk 9 by the wiper blade 15. Therefore, several embodiments of the present invention have been developed that improve the design of the wiper blade by reducing the grinding that occurs between the wiper blade, disk and pellets. However, it should be understood that these embodiments are merely improvements and are not necessary to practice the invention.

Figure 7:
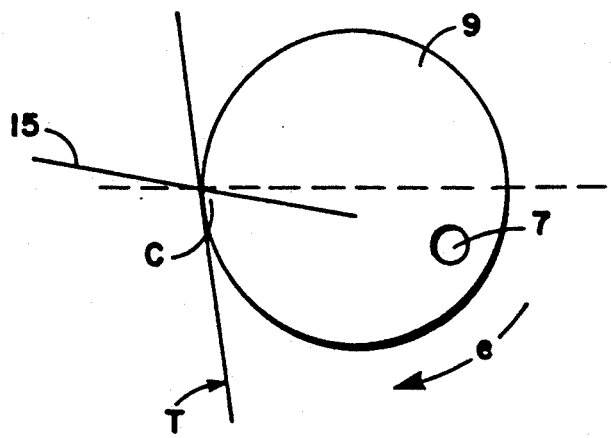
FIG. 7 is a top view of the positioning of the wiper blade relative to the disk for one embodiment of the invention.

FIG. 7 illustrates a top view of one embodiment of the invention having an improved wiper design. The wiper blade 15 is positioned downstream from the hopper discharge mouth 7 with the disk 9 rotating clockwise in the direction of arrow B. The dotted line represents the center axis of the disk 9. The improvement in the wiper design comprises the positioning of the wiper blade at an angle with respect to the disk so that the wiper blade 15 is not positioned directly above the center axis of the disk. As a result, the contact angle c, defined between the surface of the blade that contacts the pellets and a tangent drawn to the disk at the edge of the disk beyond which the wiper extends, is less than 90°. This angle relates to the angle at which the pellets will contact the wiper. When this angle is less than 90°, the pellets are wiped more freely off the edge of the disk without as much grinding between the pellets and the wiper blade.

Figure 8:
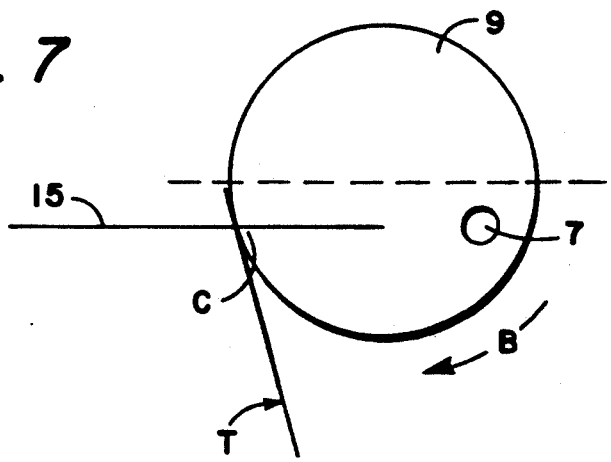
FIG. 8 is a top view of the positioning of the wiper blade relative to the disk for another embodiment of the invention.

FIG. 8 illustrates a top view of another embodiment of the invention having an improved wiper design. The wiper blade 15 is similarly positioned downstream from the hopper discharge mouth 7 with the disk 9 rotating clockwise in the direction of arrow B and the dotted line represents the center axis of the disk 9. The improvement in the wiper design comprises the positioning of the wiper blade off center with respect to the disk axis and at a location with respect to the hopper discharge mouth so that the contact angle c is less than 90°. This design yields similar results to the embodiment shown in FIG. 7 because the pellets that are rotated along with the disk similarly contact the wiper blade at an angle to the blade that is less than 90°.

Figure 9A:
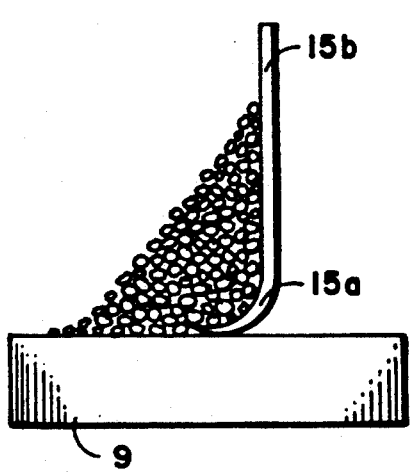
FIG. 9a is a side view of the interaction between the wiper blade and the pellet pile for one embodiment of the invention.
Figure 9B:
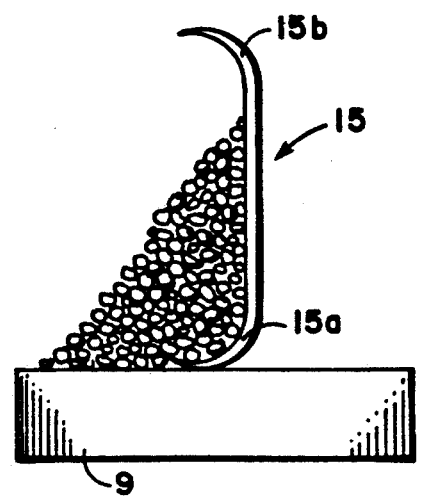
FIG. 9b is a side view of the interaction between the wiper blade and the pellet pile for another embodiment of the invention.

FIGS. 9a and 9b illustrate side views of two additional embodiments of the invention having improved wiper blade designs that reduce grinding between the wiper, disk and pellets. As shown in FIG. 9a, the wiper blade 15 is provided with a curved bottom portion 15a extending outward from the surface of the wiper that contacts the pellets. The curved bottom portion reduces grinding between the pellets and the wiper blade by essentially knifing through the pellets in much the same manner that a curved bottom surface of a snowplow operates. In an alternate embodiment shown in FIG. 9b, the wiper blade 15 is provided with a curved top surface 15b as well as a curved bottom surface 15a. The two curved surfaces act like a gutter in guiding the pellets toward the end of the disk and thereby reduce grinding between the pellets and the wiper blade. It should be understood that the improvements shown in FIGS. 9a and 9b can be utilized along with any of the designs shown in FIGS. 7–8 as well as with the basic design of the invention.

A factor that must be considered in implementing a crystal growing system that is replenishable while a crystal is being grown, is that it is desirable to prevent the solid charge material from contacting the growing crystal when the material is added to the melt. Japanese Patent No. 49-10664 issued to Yamashita discloses a replenishment system wherein this problem is avoided through the use of a two crucible system. Such a crucible, or any other system that achieves similar results, could be utilized along with the feeder of the present invention.

An important consideration in crystal growing systems is preventing contamination of the melt material. In general, there are two sources of melt contamination, i.e. the charge material itself and all materials that come into contact with it. In the present invention, all the components of the system that contact the charge material are made of non-contaminating materials. Therefore, within the feeder system, the interior surface of the hopper 1, the disk 9 and wiper blade 15 are all made from non-contaminating materials. Non contaminating materials can be either of the following two types: (1) materials that are chemically identical to the charge material or (2) materials that may be chemically different from the charge material but are inert, i.e. their presence doe not alter the crystal's properties.

As previously stated, the feeder of the present invention can be utilized to grow silicon crystals. An example of the type of charge material that can be utilized to grow silicon crystals is granulated solid polycrystalline silicon pellets manufactured by Ethyl Corporation. For silicon crystal growth, only silicon, silicon dioxide and Teflon ® coated steel are considered to be non contaminating to the poly silicon pellets. As previously stated, within the feeder system, the disk, wiper blade and interior surface of the hopper should all be made from non contaminating material. Of the three non-contaminating materials that are available for use with poly-silicon pellets, it has been found that silicon is the material that best withstands the impact and abrasions that occur during the operation of the system. Consequently, the portions of the system that are subject to severe abrasive contact with the poly silicon pellets are made from silicon. Therefore, the hopper discharge tube 5, the surface of the disk 9 and the wiper blade 15 are preferably made from silicon. The sidewalls 4 and angled sidewalls 3 of the hopper need not be made from silicon and can be made from more inexpensive Teflon ® coated steel because they do not undergo severe abrasive contact with the poly silicon pellets; the sidewalls 4 do not undergo severe abrasive contact because there is no force, gravitational or otherwise, that is applied to the pellets in the direction perpendicular to the sidewalls. However, the angled sidewalls 3 are subject to more abrasive contact that the sidewalls 4. As a result, they may require more frequent maintenance or recoating than the sidewalls 4.

Figure 10:
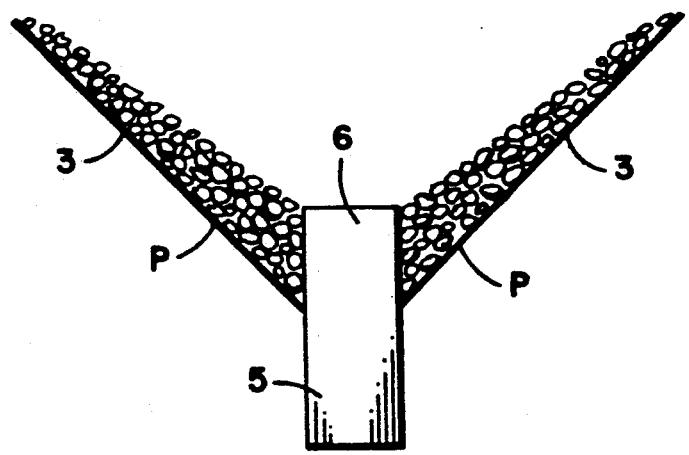
FIG. 10 is a side view of the discharge hopper mouth for one embodiment of the invention.

FIG. 10 illustrates an embodiment of the invention that lessens the cost of maintaining the system by increasing the useful life of the sidewalls 3. In this embodiment, the hopper discharge tube 5 is extended upward into the interior of the hopper and rises above the lowest portion of the angled sidewalls 3. As a result, pellet pockets p are formed along the bottom of the angled sidewalls 3 of the hopper, as well as along the sides of the sidewalls. The pellet pockets p remain stationary even as pellets are fed out of the discharge tube 5 because they are located below the opening 6 of the tube and therefore cannot flow into the tube. Because the pellets in these pockets remain stationary, they do not have abrasive contact with the sidewalls 3 of the hopper. Therefore, these sidewalls can be made from Teflon ® coated steel rather than the more expensive silicon. Similarly, if the angled sidewalls are formed with at an angle that is substantially equal to the angle of repose for the material contained in the hopper, pellets will also pile along the sidewalls 3 above the point at which the discharge tube 5 opens into the hopper. These piles will remain stationary even as pellets flow out of the hopper thereby reducing the abrasive contact to which the sidewalls 3 are subjected.

It should be understood that various changes and modifications of the embodiment shown in the drawings may be made within the scope of this invention. Thus, it is intended that all matter contained in the above description as shown in the accompanying drawings shall be interpreted in an illustrative and not limiting sense. For example, although the feeder system of the present invention is described as being utilized in a melt replenishment system for continuous crystal growth, it should be appreciated that the feeder system of the present invention can be utilized in many different applications wherein the amount of bulk material fed into a system must be controlled.

What we claim is:

1. In a crystal growing system including a heated crucible containing a pool of melted crystal material, means for lowering a seed crystal into said pool, means for withdrawing said seed crystal from said pool thereby causing a crystal to be withdrawn from said pool, and a storage hopper for storing solid pellets of said crystal material, the storage hopper having an opening for allowing said pellets to flow out of the storage hopper in a flow direction; a feeder system for providing said pellets to said pool at a controlled rate during crystal growth comprising:
   a rigid pile-forming surface located below said hopper opening for collecting pellets that flow from said opening and forming pellet piles;
   means for rotating said pile-forming surface about an axis parallel to said flow direction; and
   wiper means for contacting at least a portion of the pellet piles and for wiping pellets off of the pile-forming surface and into said pool, said wiper means maintaining a fixed orientation relative to the axis as said pile-forming means is rotated.

2. A feeder system as claimed in claim 1 wherein said pile-forming surface is constructed in order to reduce wear of said pile-forming surface caused by contact with said pellets.

3. A feeder system as claimed in claim 1 wherein said pile-forming surface is located at a fixed distance from said hopper opening so that all piles have a substantially equal cross-sectional area.

4. A feeder system as claimed in claim 1 wherein said pile-forming surface rotates about said axis at a constant rotation rate and said feed system further comprises control means for varying said rotation rate in order to vary the controlled rate at which pellets are provided to said pool.

5. A feeder system as claimed in claim 4 wherein said pile-forming surface is planar.

6. A feeder system as claimed in claim 1 comprising means for reducing grinding between the pile forming means and the wiper means as a result of the wiping off of the pellets.

7. A feeder system as claimed in claim 5 comprising means for reducing grinding between the pile forming means and the wiper means as a result of the wiping off of the pellets.

8. A feeder system as claimed in claim 1 including means for diminishing an amount of interior storage hopper area that undergoes severe abrasive contact with stored pellets as pellets flow out of the opening.

9. A feeder system as claimed in claim 7 including means for diminishing an amount of interior storage hopper area that undergoes severe abrasive contact with stored pellets as pellets flow out of the opening.

10. A feeder system as claimed in claim 1 including means for shutting off the flow of pellets from the hopper opening.

11. A feeder system as claimed in claim 9 including means for shutting off the flow of pellets from the hopper opening.

12. In a crystal growing system for growing crystals of a first material, the system including a heated crucible containing a pool of melt, the melt being a melted form of said first material, and the crystal growing system further including means for withdrawing a seed crystal from the melted material;

a feeder system for replenishing the melt during crystal growth comprising:

a storage hopper for storing solid pellets of said first material, the storage hopper having an opening for allowing flow of the solid pellets out of the storage hopper;

a plate located below said opening for receiving pellets that flow out therefrom, rotating means for rotating the plate about a rotation axis, a wiper extending across a portion of said plate, the wiper having a contacting surface for contacting pellets located on the plate and thereby causing pellets to be wiped off of the plate, said wiper maintaining a fixed orientation relative to the rotation axis as the plate is rotated;

collecting means for collecting the pellets that are wiped off of the plate and transferring them to the melt.

13. A feeder system as claimed in claim 12 wherein the wiper is spaced above the plate.

14. A feeder system as claimed in claim 12 wherein the wiper extends beyond an edge of the plate.

15. A feeder system as claimed in claim 12 wherein the wiper is spaced above the plate and extends beyond an edge of the plate.

16. A feeder system as claimed in claim 12 wherein the the plate has a concave shape.

17. A feeder system as claimed in claim 15 wherein the the plate has a concave shape.

18. A feeder system as claimed in claim 14 wherein a contact angle between the pellets and the wiper is defined between the contact surface of the wiper and a tangent drawn to the plate at the edge beyond which the wiper extends, the wiper being positioned such that said contact angle is less than 90°.

19. A feeder system as claimed in claim 18 wherein the the plate has a concave shape and the wiper is spaced above the plate.

20. A feeder system as claimed in claim 12 wherein the wiper has top and bottom portions, the bottom portion of the wiper being curved outward from the contact surface.

21. A feeder system as claimed in claim 19 wherein the wiper has top and bottom portions, the top portion of the wiper being curved outward from the contact surface.

22. A feeder system as claimed in claim 19 wherein the wiper has top and bottom portions, the top and bottom portions of the wiper being curved outward from the contact surface.

23. A feeder system as claimed in claim 12 wherein the rotation means includes control means for adjustably controlling a rate of rotation, said rate of rotation being adjustable from a rate of 0 rotation per minute to a maximum rotation rate.

24. A feeder system as claimed in claim 20 wherein the rotation means includes control means for adjustably controlling a rate of rotation, said rate of rotation being adjustable from a rate of 0 rotations per minute to a maximum rotate rate.

25. A feeder system as claimed in claim 12 wherein the opening is positioned along a radial distance away from a center of the plate such that a center of the opening is not positioned above the center of the plate.

26. A feeder system as claimed in claim 24 wherein the opening is positioned along a radial distance away from a center of the plate such that a center of the opening is not positioned above the center of the plate.

27. A feeder system as claimed in claim 12 wherein an interior surface of the storage hopper, an interior surface of the plate, the contacting surface of the wiper and the collecting means are each made from material that is non-contaminating with respect to the first material.

28. A feeder system as claimed in claim 26 wherein an interior surface of the storage hopper, an interior surface of the plate, the contacting surface of the wiper and the collecting means are each made from material that is non-contaminating with respect to the first material.

29. A feeder system as claimed in claim 12 including means for reducing an amount of interior storage hopper area that undergoes severe contract with stored pellets as pellets flow out of the opening.

30. A feeder system as claimed in claim 12 wherein the storage hopper further comprises:

sidewalls that funnel downward toward the opening and a discharge tube extending between the sidewalls and the opening, said discharge tube extending vertically upward into the hopper and rising above a bottom portion of the sidewalls.

31. A feeder system as claimed in claim 28 wherein the storage hopper further comprises:

sidewalls that funnel downward toward the opening and a discharge tube extending between the sidewalls and the opening, said discharge tube extending vertically upward into the hopper and rising above a bottom portion of the sidewalls.

32. A feeder system as claimed in claim 12 including means for reducing grinding between the wiper, plate and pellets located on the plate.

33. A feeder system as claimed in claim 15 including means for reducing grinding between the wiper, plate and pellets located on the plate.

* * * * *